US007868336B2

(12) United States Patent
Fujimoto et al.

(10) Patent No.: US 7,868,336 B2
(45) Date of Patent: Jan. 11, 2011

(54) SEMICONDUCTOR DEVICE AND METHOD OF MANUFACTURING THE SAME

(75) Inventors: Hiroaki Fujimoto, Kadoma (JP); Yoshihiro Tomita, Kadoma (JP)

(73) Assignee: Panasonic Corporation, Osaka (JP)

( * ) Notice: Subject to any disclaimer, the term of this patent is extended or adjusted under 35 U.S.C. 154(b) by 256 days.

(21) Appl. No.: 12/264,539

(22) Filed: Nov. 4, 2008

(65) Prior Publication Data

US 2009/0134505 A1 May 28, 2009

(30) Foreign Application Priority Data

Nov. 22, 2007 (JP) ............................ 2007-302332

(51) Int. Cl.
*H01L 33/00* (2010.01)
*H01L 23/02* (2010.01)
*H01L 21/00* (2010.01)

(52) U.S. Cl. ............................ 257/81; 257/98; 257/99; 257/100; 257/432; 257/433; 257/434; 257/435; 257/749; 257/178; 257/680; 438/27; 438/29; 438/64; 438/65; 438/116

(58) Field of Classification Search ...................... None
See application file for complete search history.

(56) References Cited

U.S. PATENT DOCUMENTS

| | | | | |
|---|---|---|---|---|
| 7,180,149 | B2 | 2/2007 | Yamamoto et al. | 257/434 |
| 2002/0019069 | A1 | 2/2002 | Wada | 438/69 |
| 2004/0130640 | A1 | 7/2004 | Fujimori | 348/294 |
| 2005/0161805 | A1 | 7/2005 | Ono et al. | 257/704 |
| 2006/0091486 | A1 | 5/2006 | Wataya | 257/432 |
| 2008/0042227 | A1 | 2/2008 | Asano et al. | 257/432 |

FOREIGN PATENT DOCUMENTS

JP 2007250739 A * 9/2007

* cited by examiner

*Primary Examiner*—David E Graybill
(74) *Attorney, Agent, or Firm*—Steptoe & Johnson LLP

(57) ABSTRACT

According to the present invention, protrusions 4 are formed on electrodes 3 of semiconductor elements 6, and an optical member 7 is secured on the semiconductor element 6 with an adhesive 8 so as to be pressed onto the protrusions 4.

9 Claims, 3 Drawing Sheets

SEMICONDUCTOR DEVICE AND METHOD OF MANUFACTURING THE SAME

FIELD OF THE INVENTION

The present invention relates to a semiconductor device used for a digital camera, a mobile phone, and so on, for example, a light receiving element such as a semiconductor image pickup device and a photo IC or a light emitting element such as an LED and a laser, and a method of manufacturing the same.

BACKGROUND OF THE INVENTION

As electronic equipment has been reduced in size, thickness, and weight in recent years, high-density packaging for semiconductor devices has been in increasing demand. Further, as semiconductor elements have been mounted with higher densities with advances in micromachining technology, so-called chip packaging technology has been proposed to directly mount chip-size packages or semiconductor elements of bare chips.

For example, the prior art of a semiconductor device includes an element structure and a method of manufacturing the same in which a transparent plate is bonded on an image pickup region of a semiconductor element with an adhesive in a semiconductor image pickup device and the thickness of the semiconductor image pickup device is reduced with lower cost (for example, see WO2005/022631).

In this method, as shown in FIG. 3, a protective member 24 made of glass and so on is secured with an adhesive 23 on a semiconductor element 22 having an image pickup region 21 thereon, through holes 26 are formed directly under electrodes 25 of the semiconductor element 22, and an insulating layer 27 is formed on the inner walls of the through holes 26 and the underside of the semiconductor element 22. After that, the electrodes 25 and external electrodes 30 formed on the underside of the semiconductor element 22 are electrically connected to each other via conductor layers 28, so that the semiconductor image pickup device is obtained. Thus the external size of the semiconductor image pickup device can be as small as a so-called chip size, like the semiconductor element 22.

In the semiconductor device of the prior art, however, the through holes are formed on the semiconductor element by dry etching such as plasma etching and RIE and a semiconductor wafer has a large thickness of about 50 μm to 200 μm. Such deep etching requires a long time in a manufacturing process, increasing the cost of a product.

Since the through holes have a large aspect ratio, the insulating film becomes thin at the bottoms of the through holes when the insulating film is formed in the through holes in a process after the through holes are formed. Further, when the conductor layer is formed in the through holes by plating, a plating solution hardly enters near the bottoms of the through holes and the conductor layer is unevenly formed, so that desired electrical characteristics cannot be obtained for the product and the yield is reduced. Consequently, the cost of the product is similarly increased.

DISCLOSURE OF THE INVENTION

The present invention has been devised to solve the problem of the prior art. An object of the present invention is to provide a semiconductor device and a method of manufacturing the same which can shorten a time period required for a manufacturing process, suppress a decrease in the yield of a product, and achieve a reliable element structure with high mass productivity while suppressing an increase in the cost of the product.

In order to solve the problem, a semiconductor device of the present invention includes: a semiconductor element having a plurality of electrodes formed on a major surface of the semiconductor element to be connected to protrusions; and an optical member bonded on the semiconductor element with a transparent adhesive member so as to cover the protrusions and the electrodes, wherein the optical member is in contact with the protrusions, the transparent adhesive member has a larger displacement relative to a stress than the protrusions, and the plurality of electrodes are electrically connected to external electrodes formed on the other surface of the semiconductor element, via through holes for continuity formed on the semiconductor element.

A method of manufacturing the semiconductor device according to the present invention includes the steps of: virtually dividing a semiconductor wafer into a plurality of semiconductor elements at regular intervals; forming a plurality of electrodes for each of the semiconductor elements on a major surface of the semiconductor wafer; connecting protrusions to the respective electrodes; bonding an optical member to the semiconductor wafer with a transparent adhesive member such that the optical member covers the electrodes and the protrusions and is in contact with the protrusions; polishing the other surface of the semiconductor wafer; forming through holes for continuity near portions directly under the electrodes on the other surface of the semiconductor wafer; forming an insulating film on the inner walls of the through holes for continuity and the other surface of the semiconductor wafer; forming conductor layers on the insulating film on the inner walls of the through holes for continuity and on parts adjacent to the inner walls of the through holes for continuity on the insulating film on the other surface of the semiconductor wafer, so that the conductor layers act as external electrodes on the other surface of the semiconductor wafer and the external electrodes are electrically connected to the electrodes via the conductor layers; and cutting the semiconductor wafer into the semiconductor elements to obtain the individual semiconductor devices.

In this configuration, a pressure applied to the semiconductor element becomes large directly under the electrodes through the protrusions during polishing on the semiconductor element, so that portions directly under the electrodes are locally reduced in thickness after polishing.

It is thus possible to shorten an etching time when forming the through holes for continuity after polishing the semiconductor element, thereby providing an inexpensive product.

Further, the protrusions act as spacers in a bonding structure of the semiconductor element and the optical member, and thus a shrinkage stress is applied when the transparent adhesive member is cured. Even when an ambient temperature increases during the use of the semiconductor device, the thickness of the transparent adhesive member does not change, thereby improving the quality of optical characteristics.

Further, the through holes for continuity are disposed directly under the electrodes, and each of the through holes for continuity has two different angles as angles formed by the sides of the through hole for continuity and the major surface of the semiconductor element.

Moreover, the through holes for continuity are disposed directly under the electrodes, each of the through holes for continuity has two different angles as angles formed by the sides of the through hole for continuity and the major surface of the semiconductor element, and the smaller angle is formed by the side of the through hole for continuity near the other surface of the semiconductor element.

Further, the method of manufacturing the semiconductor device further includes the step of forming recessed portions on the semiconductor wafer during polishing on the other surface of the semiconductor wafer so as to be disposed directly under the protrusions, the recessed portion being formed as a part of the through hole for continuity.

Moreover, the through holes for continuity are disposed directly under the electrodes, and different angles are formed by a side of the recessed portion and a portion of the through hole for continuity other than the recessed portion as angles formed by the sides of the through holes for continuity and the major surface of the semiconductor element.

Further, the through holes for continuity are disposed directly under the electrodes, different angles are formed by a side of the recessed portion and a portion of the through hole for continuity other than the recessed portion as angles formed by the sides of the through holes for continuity and the major surface of the semiconductor element, and the smaller angle is formed by the recessed portion.

With this configuration, the recessed portions formed on the semiconductor element during polishing are shaped like bowls which facilitate the injection of a plating solution into the through holes for continuity during the formation of the conductor layers, thereby improving a yield in plating.

According to the semiconductor device of the present invention, the protrusions are formed by joining metal balls formed on the ends of thin metal wires made of Au.

According to the method of manufacturing the semiconductor device, the protrusions are formed by joining metal balls formed on the ends of thin metal wires made of Au.

It is thus possible to easily form the protrusions on the electrodes of the semiconductor element, achieving an inexpensive product.

As has been discussed, according to the present invention, the protrusions having higher stiffness than the transparent adhesive member for securing the optical member are formed on the electrodes of the semiconductor element, so that a pressure applied during polishing on the semiconductor element is concentrated on portions of the semiconductor element directly under the electrodes through the protrusions, so that the portions are locally reduced in thickness after polishing.

It is thus possible to shorten an etching time when forming the through holes for continuity after polishing the semiconductor element, thereby providing an inexpensive product.

Moreover, the recessed portions formed on the semiconductor element during polishing are shaped like bowls which facilitate the injection of a plating solution into the through holes for continuity during the formation of the conductor layers, thereby improving a yield in plating.

Further, the protrusions act as spacers in a bonding structure of the semiconductor element and the optical member and thus a shrinkage stress is applied when the transparent adhesive member is cured. Even when an ambient temperature increases during the use of the semiconductor device, the thickness of the transparent adhesive member does not change, thereby improving the quality of optical characteristics.

Consequently, it is possible to shorten a time period required for a manufacturing process, suppress a decrease in the yield of a product, and achieve a reliable element structure with high mass productivity while suppressing an increase in the cost of the product.

DESCRIPTION OF THE EMBODIMENT

Figure 1:
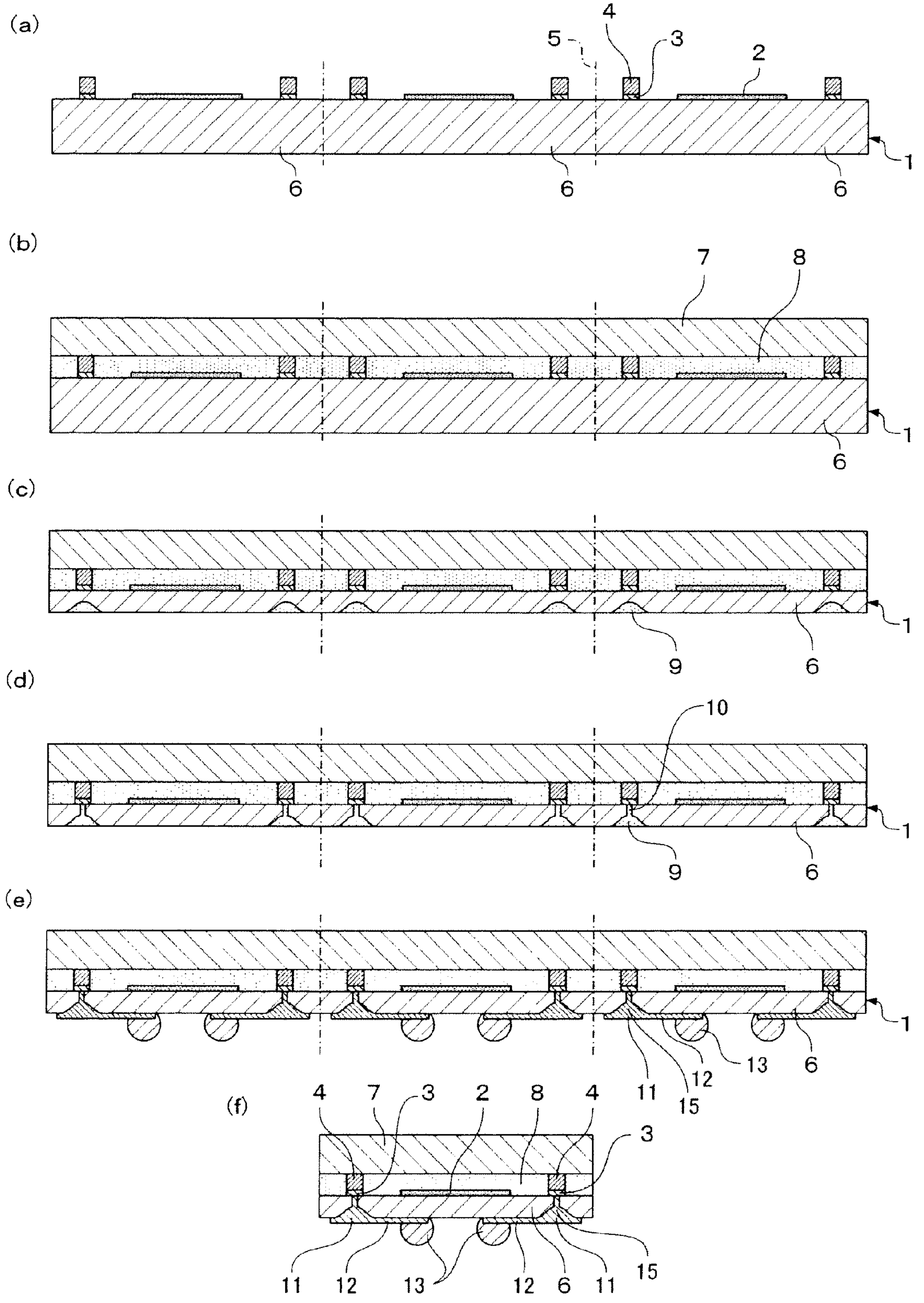
FIGS. 1A to 1F are process sectional views schematically showing a method of manufacturing a semiconductor device according to an embodiment of the present invention.

A semiconductor device representing an embodiment of the present invention and a method of manufacturing the same will be specifically described below in accordance with the accompanying drawings. Regarding constituent elements indicated by the same reference numerals in the drawings, the explanation thereof may be omitted. Further, in the drawings, the constituent elements are mainly shown in schematic form for clear understanding and thus the shapes and the like may not be correctly illustrated.

First, as a semiconductor device of the present embodiment, a semiconductor image pickup device which is a kind of light receiving element will be described as an example.

FIGS. 1A to 1F are process sectional views schematically showing the method of manufacturing the semiconductor image pickup device acting as the semiconductor device of the present embodiment. FIG. 2 is a sectional view specifically showing a through hole for continuity in the semiconductor image pickup device acting as the semiconductor device of the present embodiment.

In FIGS. 1A to 1F and 2, reference numeral 1 denotes a semiconductor wafer, reference numeral 2 denotes image pickup regions, reference numeral 3 denotes electrodes, reference numeral 4 denotes protrusions, reference numeral 5 denotes cut lines, reference numeral 6 denotes semiconductor elements, reference numeral 7 denotes an optical member, reference numeral 8 denotes an adhesive (transparent adhesive member), reference numeral 9 denotes recessed portions, reference numeral 10 denotes through holes, reference numeral 11 denotes through hole conductor portions (conductor layers), reference numeral 12 denotes external electrodes (conductor layers), reference numeral 13 denotes solder balls, reference numeral 14 denotes an insulating film, and reference numeral 15 denotes through holes for continuity.

Figure 2:
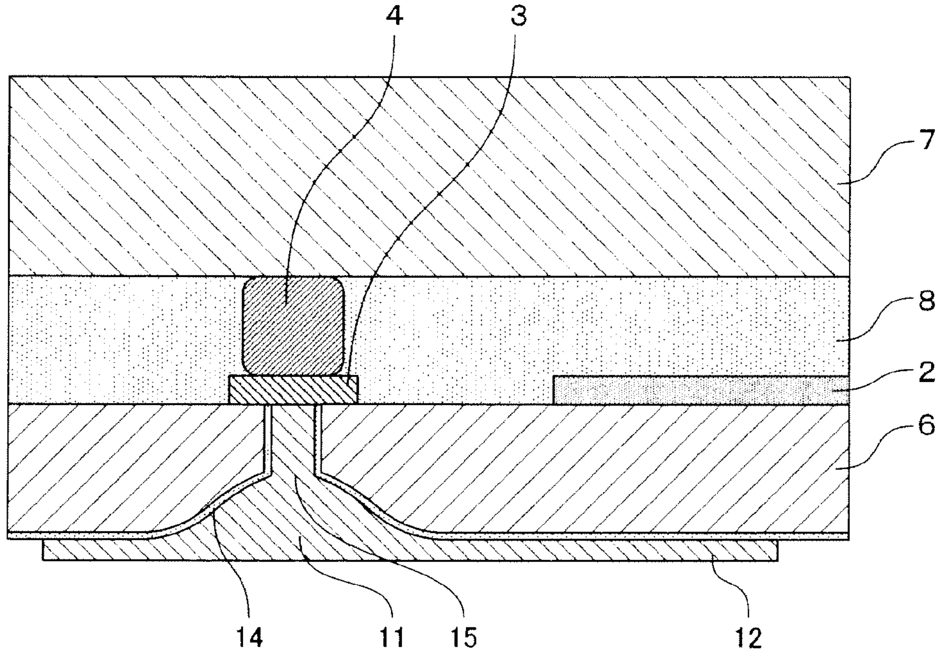
FIG. 2 is a detail drawing showing a through hole for continuity in the semiconductor device according to the embodiment of the present invention.
Figure 3:
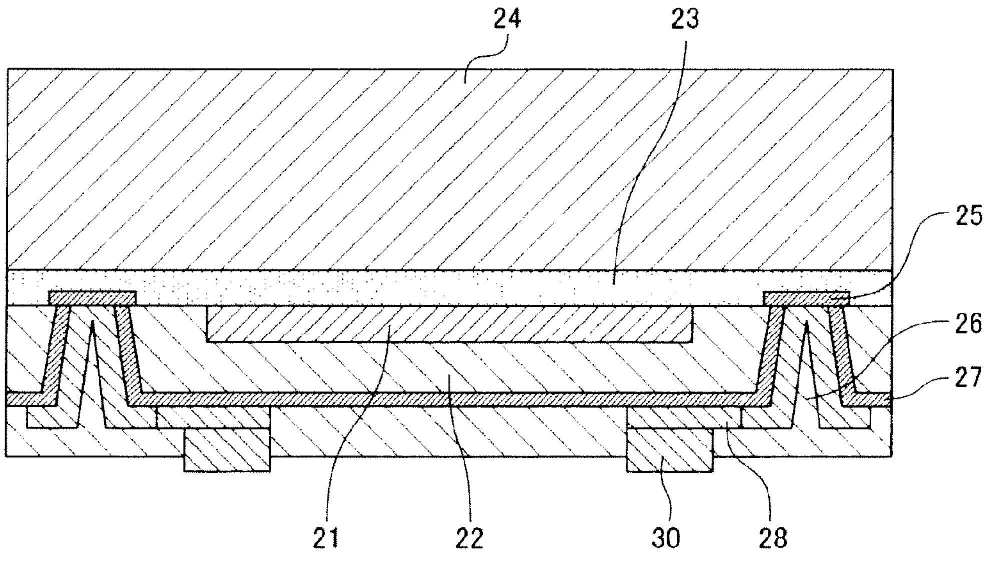
FIG. 3 is a sectional view showing the configuration of a semiconductor device of the prior art.

First, as shown in FIG. 1A, the semiconductor wafer 1 is virtually divided into a plurality of semiconductor elements 6 at regular intervals, and the image pickup regions 2 and the electrodes 3 are formed at predetermined positions on the semiconductor elements 6. Next, the protrusions 4 are formed on the electrodes 3 on the semiconductor elements 6. In this case, the semiconductor wafer 1 is a disk-like semiconductor substrate which is made of, for example, a material such as silicon, germanium, or a compound semiconductor material (for example, GaAs, InP, GaN, SiC, and so on), has a thickness of about 200 μm to 800 μm, and ranges in size from about 2 inches to 15 inches in diameter.

The protrusions 4 are formed on the electrodes 3 by so-called ball bumping using a wire bonder. Spherical protrusions formed on the ends of Au thin metal wires (Au wires) are bonded to the electrodes 3 on the semiconductor elements 6 by ultrasonic thermocompression bonding and so on. The used Au wires are about 15 μm to 30 μm in diameter, and the spherical protrusions formed on the ends of the Au wires range in size from about 30 μm to 90 μm in diameter. The spherical Au protrusions carry a load of about 10 g to 100 g and are heated at about 80° C. to 150° C. The protrusions 4 formed thus are about 40 μm to 150 μm in diameter and are about 10 μm to 80 μm in thickness.

According to this method, the protrusions 4 can be sized with quite high precision and thus it is possible to keep a constant distance between the optical member 7, which is bonded later on the semiconductor elements 6, and the image pickup regions 2 on the semiconductor elements 6, thereby achieving a high-quality structure with small variations as a semiconductor image pickup device. Moreover, the protrusions 4 can be formed also by plating Ni, Au, Cu and the like on the electrodes 3 or selectively forming photoresist on the electrodes 3 by photolithography. In both forming methods, the protrusions 4 have higher stiffness than the adhesive 8 for bonding the optical member 7 later.

In other words, the adhesive 8 has a larger displacement relative to a stress than the protrusions 4. The protrusions 4 are made of a metal such as Au in the present embodiment and thus have a modulus of elasticity of about 10 GPa to 300 GPa. The adhesive 8 does not normally contain a filler and is composed of epoxy, silicone, acrylic, and so on with a modulus of elasticity of about 0.01 GPa to 10 GPa. Thus the adhesive 8 can easily have a larger displacement relative to a stress.

Next, as shown in FIG. 1B, the optical member 7 made of glass and so on is secured on the semiconductor wafer 1 with the adhesive 8 so as to cover the image pickup regions 2 on the semiconductor elements 6 formed in the semiconductor wafer 1. The optical member 7 is made of glass, resin, and so on and has a thickness of about 0.05 mm to 1.0 mm. The optical member 7 has the same size as the semiconductor wafer 1 and the size ranges from about 2 inches to 15 inches in diameter. The adhesive 8 is a resin of epoxy, silicone, acrylic, and so on.

In a method of securing the optical member 7, the adhesive 8 is first applied onto the semiconductor wafer 1. The adhesive 8 is applied by a dispenser, a printing method, spin coating using a spinner, and so on. After that, the optical member 7 is set on the semiconductor wafer 1. The optical member 7 at this point is pressed to be in contact with the protrusions 4.

The protrusions 4 are formed on the electrodes 3 before the optical member 7 is set. The protrusions 4 having been formed on positions corresponding to the electrodes 3 may be set on the semiconductor wafer 1 when the optical member 7 is set.

In the foregoing method, in a sequence of application of the adhesive 8 onto the semiconductor wafer 1, the optical member 7 is set after the adhesive 8 is applied. The optical member 7 may be set and temporarily secured on the semiconductor wafer 1 before the adhesive 8 is applied. The adhesive 8 may be injected into gaps formed by the protrusions 4 between the semiconductor wafer 1 and the optical member 7. At this point, the adhesive 8 is injected in a vacuum, so that the adhesive 8 can be formed on the semiconductor wafer 1 in a short time without generating bubbles.

After that, the adhesive 8 is cured and completed. When the adhesive 8 is an ultraviolet curing adhesive, the adhesive 8 is cured by emitting ultraviolet rays onto the adhesive 8 through the optical member 7. When the adhesive 8 is a thermosetting adhesive, the adhesive 8 is cured by heating the adhesive 8 at 50° C. to 200° C. with a curing oven, a hot plate, an infrared lamp, and so on.

Next, as shown in FIG. 1C, the underside of the semiconductor wafer 1 is polished to reduce the thickness of the semiconductor wafer 1. After polished, the semiconductor wafer 1 has a thickness of about 10 μm to 500 μm. The semiconductor wafer 1 is polished by mechanical polishing for polishing the pressurized semiconductor wafer 1 with a rotating grindstone, dry etching, and so on. In the case of mechanical polishing, the protrusions 4 have higher stiffness than the adhesive 8, and thus a weight added by pressurizing the semiconductor wafer 1 is intensively applied to portions of the semiconductor wafer 1 directly under the protrusions 4. Thus the portions of the semiconductor wafer 1 directly under the protrusions 4 have a larger polishing amount than the other regions, so that on the semiconductor wafer 1, the recessed portions 9 are formed directly below the protrusions 4. The recessed portions 9 are about 10 μm to 200 μm in diameter and about 3 μm to 100 μm in depth.

Then, as shown in FIG. 1D, the through holes 10 reaching the electrodes 3 are formed on the semiconductor wafer 1, directly under the electrodes 3 of the semiconductor elements 6. The through holes 10 are formed as follows: resist and the like are selectively formed on the underside of the semiconductor wafer 1, and exposed portions on the underside of the semiconductor wafer 1 are etched by plasma etching, wet etching, and so on. At this point, Si and the insulating film under the electrodes 3 are also removed to expose the undersides of the electrodes 3.

Further, at this point, the recessed portions 9 have been formed in the semiconductor element 6 during polishing on the portions of the semiconductor wafer 1, directly under the electrodes 3. It is thus possible to shorten an etching time for forming the through holes 10, provide an inexpensive semiconductor image pickup device, allow the through holes 10 to have small diameters because of the small depths of the through holes 10, easily obtain a structure with smaller designs, and effectively increase the pins of the electrodes 3. The through holes 15 for continuity at this point include the through holes 10 and the recessed portions 9.

Next, as shown in FIG. 1E, the insulating film such as a silicon oxide film (not shown) is formed in the recessed portions 9 of the semiconductor wafer 1, on the inner walls of the through holes 10, and over the underside of the semiconductor wafer 1. The insulating film at the bottoms of the through holes 10 is removed by photoetching and so on. After that, the conductor layers 11 and 12 are selectively formed in the recessed portions 9, in the through holes 10, and on the underside of the semiconductor wafer 1. The conductor layers 12 act as the external electrodes 12 and the solder balls 13 are formed in the regions of the external electrodes 12.

FIG. 2 is a sectional view specifically showing the through hole 15 for continuity. The insulating film 14 illustrated in FIG. 1E is easily formed by a method of forming a silicon oxide film by plasma CVD and a method of forming resin such as polyimide by spin coating.

The insulating film 14 is temporarily formed at the bottoms of the through holes 10. Thus after photoresist is selectively formed by photolithography, the insulating film at the bottoms of the through holes 10 is removed by plasma etching, wet etching, and so on.

The conductor layer 11 in the through hole 15 for continuity is formed by forming a metal film of Ni, Cu, Au and so on by electrolytic plating after a Ti/Cu film and the like are evaporated by sputtering and so on. The metal film has a thickness of about 0.1 μm to 2 μm. Before evaporation on the metal film by sputtering, the electrodes 3 at the bottoms of the through holes 15 for continuity are slightly etched by dry etching and wet etching so as to connect the evaporated metal film and the electrodes 3 at the bottoms of the through holes 10 with a low resistance. At this point, the electrodes 3 have a small thickness of about 1 μm. Thus even if the electrodes 3 at the bottoms of the through holes 15 for continuity are removed by over etching, the protrusions 4 can prevent a reduction in yield.

After that, the conductor layers 11 are formed by plating such as electrolytic plating and electroless plating. At this point, since the through holes 10 are formed at the bottoms of the recessed portions 9, the aspect ratio is small and a plating solution easily enters the through holes 10. Thus the conductor layers 11 can be easily formed in the through holes 10. In FIGS. 1E and 1F, the conductor layers 11 are formed over the insides of the through holes 10 and the recessed portions 9. The conductor layers 11 may be formed only over the inner walls of the through holes 10 and the inner surfaces of the recessed portions 9.

Next, as shown in FIG. 1F, the semiconductor wafer 1 is divided along the cut lines 5 into the semiconductor elements 6, so that the individual semiconductor image pickup devices are obtained. The semiconductor wafer 1 is divided into the semiconductor image pickup devices by simultaneously cutting the optical member 7 and the semiconductor wafer 1 by a dicing method and so on.

In the completed semiconductor image pickup device, the adhesive 8 has a shrinkage stress at least in the thickness direction. Thus dimensions between the optical member 7 and the image pickup region surface of the semiconductor element 6 are not changed by a change in ambient temperature after the device is installed into equipment, thereby achieving optical characteristics of high quality.

In the foregoing explanation, the semiconductor device is a semiconductor image pickup device which is a kind of light receiving element. The light receiving element may be a photo IC and the like (not shown) in addition to a semiconductor image pickup device.

Figure 4A:
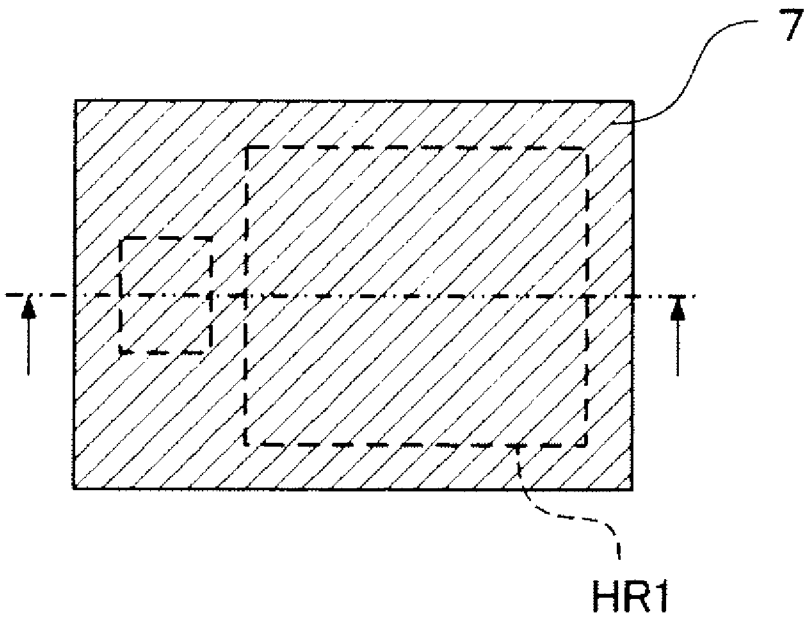
FIG. 4A is a plan view showing a structural example in which the semiconductor device according to the embodiment of the present invention is applied to an LED which is a light emitting element.
Figure 4B:
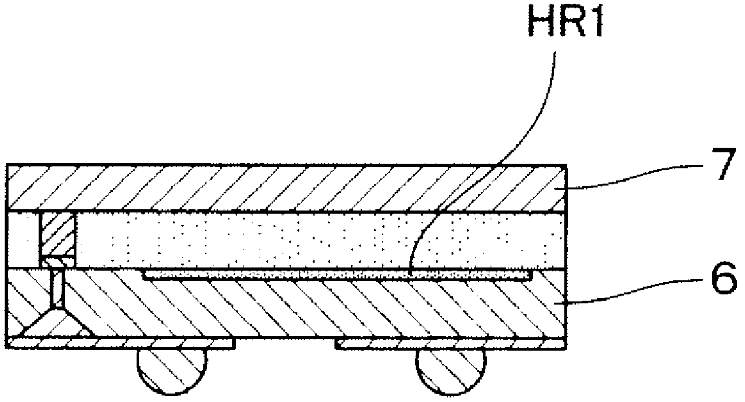
FIG. 4B is a sectional view showing the structural example in which the semiconductor device according to the embodiment of the present invention is applied to the LED which is a light emitting element.

In the foregoing embodiment, the semiconductor device is a light receiving element such as a semiconductor image pickup device and a photo IC. The embodiment can be similarly implemented and the same effect can be obtained also when the semiconductor device is a kind of light emitting element illustrated in plan view of FIG. 4A and a sectional view of FIG. 4B taken along a line of FIG. 4A, the semiconductor device is an LED having a light emitting region HR1 between an optical member 7 and a semiconductor element 6, and the semiconductor device is a laser light emitting element (not shown).

What is claimed is:

1. A semiconductor device, comprising:

a semiconductor element having a plurality of electrodes formed on a major surface of the semiconductor element to be connected to protrusions; and an optical member bonded on the semiconductor element with a transparent adhesive member so as to cover the protrusions and the electrodes, wherein the optical member is in contact with the protrusions, the transparent adhesive member has a larger displacement relative to a stress than the protrusions, and the plurality of electrodes are electrically connected to external electrodes formed on an other surface of the semiconductor element, via through holes for continuity formed on the semiconductor element.

2. The semiconductor device according to claim 1, wherein the through holes for continuity are disposed directly under the electrodes, and each of the through holes for continuity has two different angles as angles formed by sides of the through hole for continuity and the major surface of the semiconductor element.

3. The semiconductor device according to claim 1, wherein the through holes for continuity are disposed directly under the electrodes, each of the through holes for continuity has two different angles as angles formed by sides of the through hole for continuity and the major surface of the semiconductor element, and the smaller angle is formed by the side of the through hole for continuity near the other surface of the semiconductor element.

4. The semiconductor device according to claim 1, wherein the protrusions are formed by joining metal balls formed on ends of thin metal wires made of Au.

5. A method of manufacturing a semiconductor device, comprising the steps of:

virtually dividing a semiconductor wafer into a plurality of semiconductor elements at regular intervals;

forming a plurality of electrodes for each of the semiconductor elements on a major surface of the semiconductor wafer;

connecting protrusions to the respective electrodes;

bonding an optical member to the semiconductor wafer with a transparent adhesive member such that the optical member covers the electrodes and the protrusions and is in contact with the protrusions;

polishing an other surface of the semiconductor wafer;

forming through holes for continuity near portions directly under the electrodes on the other surface of the semiconductor wafer;

forming an insulating film on inner walls of the through holes for continuity and the other surface of the semiconductor wafer;

forming conductor layers on the insulating film on the inner walls of the through holes for continuity and on parts adjacent to the inner walls of the through holes for continuity on the insulating film on the other surface of the semiconductor wafer, so that the conductor layers act as external electrodes on the other surface of the semiconductor wafer and the external electrodes are electrically connected to the electrodes via the conductor layers; and cutting the semiconductor wafer into the semiconductor elements to obtain the individual semiconductor devices.

6. The method of manufacturing a semiconductor device according to claim 5, further comprising the step of forming recessed portions on the semiconductor wafer during polishing on the other surface of the semiconductor wafer so as to be disposed directly under the protrusions, the recessed portion being formed as a part of the through hole for continuity.

7. The method of manufacturing a semiconductor device according to claim 5, wherein the through holes for continuity are disposed directly under the electrodes, and different angles are formed by a side of the recessed portion and a portion of the through hole for continuity other than the recessed portion as angles formed by sides of the through holes for continuity and the major surface of the semiconductor element.

8. The method of manufacturing a semiconductor device according to claim 5, wherein the through holes for continuity are disposed directly under the electrodes, different angles are formed by a side of the recessed portion and a portion of the through hole for continuity other than the recessed portion as angles formed by sides of the through holes for continuity and the major surface of the semiconductor element, and the smaller angle is formed by the recessed portion.

9. The method of manufacturing a semiconductor device according to claim 5, wherein the protrusions are formed by joining metal balls formed on ends of thin metal wires made of Au.

* * * * *